(12) United States Patent
Nguyen et al.

(10) Patent No.: US 8,514,628 B2
(45) Date of Patent: Aug. 20, 2013

(54) DYNAMIC SWITCHING APPROACH TO REDUCE AREA AND POWER CONSUMPTION OF HIGH VOLTAGE CHARGE PUMPS

(75) Inventors: Qui Vi Nguyen, San Jose, CA (US);
Khin Htoo, San Jose, CA (US);
Jonathan Huynh, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 147 days.

(21) Appl. No.: 13/240,664

(22) Filed: Sep. 22, 2011

(65) Prior Publication Data

US 2013/0077411 A1    Mar. 28, 2013

(51) Int. Cl.
*G11C 11/34*    (2006.01)
*G11C 16/04*    (2006.01)
*G11C 7/00*    (2006.01)
*G05F 1/10*    (2006.01)

(52) U.S. Cl.
USPC ............ 365/185.18; 365/185.23; 365/189.07; 365/189.19

(58) Field of Classification Search
USPC ............. 365/185.18, 185.23, 189.07, 189.19; 327/536
See application file for complete search history.

(56) References Cited

U.S. PATENT DOCUMENTS

| | | | |
|---|---|---|---|
| 3,697,860 A | 10/1972 | Baker | |
| 4,271,461 A | 6/1981 | Hoffmann et al. | |
| 4,511,811 A | 4/1985 | Gupta | |
| 4,583,157 A | 4/1986 | Kirsch et al. | |
| 4,636,748 A | 1/1987 | Latham | |
| 4,736,121 A | 4/1988 | Cini et al. | |
| 4,888,738 A | 12/1989 | Wong et al. | |
| 5,140,182 A | 8/1992 | Ichimura | |
| 5,168,174 A | 12/1992 | Naso et al. | |
| 5,175,706 A | 12/1992 | Edme | |
| 5,263,000 A | 11/1993 | Van Buskirk et al. | |
| 5,335,198 A | 8/1994 | Van Buskirk et al. | |
| 5,392,205 A | 2/1995 | Zavaleta | |
| 5,436,587 A | 7/1995 | Cernea | |

(Continued)

FOREIGN PATENT DOCUMENTS

| | | |
|---|---|---|
| DE | 10 2007 026290 | 7/2008 |
| EP | 0 382 929 A | 8/1990 |

(Continued)

OTHER PUBLICATIONS

Feng Pan et al., "Charge Pump Circuit Design", McGraw-Hill, 2006, 26 pages.

(Continued)

*Primary Examiner* — Ly D Pham
(74) *Attorney, Agent, or Firm* — Davis Wright Tremaine LLP (57) ABSTRACT

A charge pump system uses a dynamic switching approach, where the pump connections are independent of the load for each output. One large pump is designed to be shared between all of the outputs for use during the ramp up during recovery, with each output level also have one designated pump to maintain its level when under regulation. Each small pump is designed with capability that can maintain its output at its regulation level. Each of these pumps can be tailored to the corresponding output level, such as the number of stages being higher in the pump to supply the higher output level. The large pump unit is constructed to be ample to provide sufficient drive to be able to assist in the ramp up phase for all of the outputs and has as many switches needed to connect the pump with all the needed outputs.

10 Claims, 5 Drawing Sheets

(56) References Cited

U.S. PATENT DOCUMENTS

| | | |
|---|---|---|
| 5,483,434 A | 1/1996 | Seesink |
| 5,508,971 A | 4/1996 | Cernea et al. |
| 5,521,547 A | 5/1996 | Tsukada |
| 5,563,779 A | 10/1996 | Cave et al. |
| 5,563,825 A | 10/1996 | Cernea et al. |
| 5,568,424 A | 10/1996 | Cernea et al. |
| 5,570,315 A | 10/1996 | Tanaka et al. |
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik et al. |
| 5,693,570 A | 12/1997 | Cernea et al. |
| 5,732,039 A | 3/1998 | Javanifard et al. |
| 5,734,286 A | 3/1998 | Takeyama et al. |
| 5,767,735 A | 6/1998 | Javanifard et al. |
| 5,781,473 A | 7/1998 | Javanifard et al. |
| 5,801,987 A | 9/1998 | Dinh |
| 5,818,766 A | 10/1998 | Song |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,973,546 A | 10/1999 | Le et al. |
| 5,982,222 A | 11/1999 | Kyung |
| 6,008,690 A | 12/1999 | Takeshima et al. |
| 6,018,264 A | 1/2000 | Jin |
| 6,023,187 A | 2/2000 | Camacho et al. |
| 6,026,002 A | 2/2000 | Viehmann |
| 6,046,935 A | 4/2000 | Takeuchi et al. |
| 6,104,225 A | 8/2000 | Taguchi et al. |
| 6,107,862 A | 8/2000 | Mukainakano et al. |
| 6,134,145 A | 10/2000 | Wong |
| 6,151,229 A | 11/2000 | Taub et al. |
| 6,154,088 A | 11/2000 | Chevallier et al. |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,285,622 B1 | 9/2001 | Haraguchi et al. |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo et al. |
| 6,329,869 B1 | 12/2001 | Matano |
| 6,344,959 B1 | 2/2002 | Milazzo |
| 6,344,984 B1 | 2/2002 | Miyazaki |
| 6,359,798 B1 | 3/2002 | Han et al. |
| 6,369,642 B1 | 4/2002 | Zeng et al. |
| 6,370,075 B1 | 4/2002 | Haeberli et al. |
| 6,400,202 B1 | 6/2002 | Fifield et al. |
| 6,404,274 B1 | 6/2002 | Hosono et al. |
| 6,424,570 B1 | 7/2002 | Le et al. |
| 6,445,243 B2 | 9/2002 | Myono |
| 6,456,170 B1 | 9/2002 | Segawa et al. |
| 6,476,666 B1 | 11/2002 | Palusa et al. |
| 6,486,728 B2 | 11/2002 | Kleveland |
| 6,518,830 B2 | 2/2003 | Gariboldi et al. |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Wong et al. |
| 6,577,535 B2 | 6/2003 | Pasternak |
| 6,606,267 B2 | 8/2003 | Wong |
| 6,724,241 B1 | 4/2004 | Bedarida et al. |
| 6,734,718 B1 | 5/2004 | Pan |
| 6,760,262 B2 | 7/2004 | Haeberli et al. |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,859,091 B1 | 2/2005 | Nicholson et al. |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hausmann |
| 6,944,058 B2 | 9/2005 | Wong |
| 6,975,135 B1 | 12/2005 | Bui |
| 6,990,031 B2 | 1/2006 | Hashimoto et al. |
| 6,995,603 B2 | 2/2006 | Chen et al. |
| 7,002,381 B1 | 2/2006 | Chung |
| 7,023,260 B2 | 4/2006 | Thorp et al. |
| 7,030,683 B2 | 4/2006 | Pan et al. |
| 7,113,023 B2 | 9/2006 | Cernea |
| 7,116,154 B2 | 10/2006 | Guo |
| 7,116,155 B2 | 10/2006 | Pan |
| 7,120,051 B2 | 10/2006 | Gorobets et al. |
| 7,129,759 B2 | 10/2006 | Fukami |
| 7,135,910 B2 | 11/2006 | Cernea |
| 7,135,911 B2 | 11/2006 | Imamiya |
| 7,208,996 B2 | 4/2007 | Suzuki et al. |
| 7,224,591 B2 | 5/2007 | Kaishita et al. |
| 7,227,780 B2 | 6/2007 | Komori et al. |
| 7,239,192 B2 | 7/2007 | Tailliet |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,928 B2 | 3/2008 | Li |
| 7,368,979 B2 | 5/2008 | Govindu et al. |
| 7,397,677 B1 | 7/2008 | Collins et al. |
| 7,436,241 B2 | 10/2008 | Chen et al. |
| 7,468,628 B2 | 12/2008 | Im et al. |
| 7,495,500 B2 | 2/2009 | Al-Shamma et al. |
| 7,521,978 B2 | 4/2009 | Kim et al. |
| 7,554,311 B2 | 6/2009 | Pan |
| 7,579,903 B2 | 8/2009 | Oku |
| 7,671,572 B2 | 3/2010 | Chung |
| 7,696,812 B2 | 4/2010 | Al-Shamma et al. |
| 7,772,914 B2 | 8/2010 | Jung |
| 7,795,952 B2 | 9/2010 | Lui et al. |
| 7,956,673 B2 | 6/2011 | Pan |
| 7,969,235 B2 | 6/2011 | Pan |
| 7,973,592 B2 | 7/2011 | Pan |
| 8,093,953 B2 | 1/2012 | Pierdomenico et al. |
| 8,193,853 B2 | 6/2012 | Hsieh et al. |
| 2002/0008566 A1 | 1/2002 | Taito et al. |
| 2002/0014908 A1 | 2/2002 | Lauterbach |
| 2002/0075706 A1 | 6/2002 | Foss et al. |
| 2002/0130701 A1 | 9/2002 | Kleveland |
| 2002/0140463 A1 | 10/2002 | Cheung |
| 2003/0128560 A1 | 7/2003 | Saiki et al. |
| 2003/0214346 A1 | 11/2003 | Pelliconi |
| 2004/0046603 A1 | 3/2004 | Bedarida et al. |
| 2005/0093614 A1 | 5/2005 | Lee |
| 2005/0195017 A1 | 9/2005 | Chen et al. |
| 2005/0237103 A1 | 10/2005 | Cernea |
| 2005/0248386 A1 | 11/2005 | Pan et al. |
| 2006/0098505 A1 | 5/2006 | Cho et al. |
| 2006/0114053 A1 | 6/2006 | Sohara et al. |
| 2006/0244518 A1 | 11/2006 | Byeon et al. |
| 2006/0250177 A1 | 11/2006 | Thorp et al. |
| 2007/0001745 A1 | 1/2007 | Yen |
| 2007/0053216 A1 | 3/2007 | Alenin |
| 2007/0069805 A1 | 3/2007 | Choi et al. |
| 2007/0126494 A1 | 6/2007 | Pan |
| 2007/0139099 A1 | 6/2007 | Pan |
| 2007/0139100 A1 | 6/2007 | Pan |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0012627 A1 | 1/2008 | Kato |
| 2008/0024096 A1 | 1/2008 | Pan |
| 2008/0042731 A1 | 2/2008 | Daga et al. |
| 2008/0111604 A1 | 5/2008 | Boerstler et al. |
| 2008/0116963 A1 | 5/2008 | Jung |
| 2008/0136500 A1 | 6/2008 | Frulio et al. |

| | | |
|---|---|---|
| 2008/0157852 A1 | 7/2008 | Pan |
| 2008/0157859 A1 | 7/2008 | Pan |
| 2008/0218134 A1 | 9/2008 | Kawakami |
| 2008/0239802 A1 | 10/2008 | Thorp |
| 2008/0239856 A1 | 10/2008 | Thorp |
| 2008/0278222 A1 | 11/2008 | Conti et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0091366 A1 | 4/2009 | Baek et al. |
| 2009/0121780 A1 | 5/2009 | Chen et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Raghavan |
| 2009/0174441 A1 | 7/2009 | Gebara et al. |
| 2009/0219077 A1 | 9/2009 | Pietri et al. |
| 2009/0296488 A1 | 12/2009 | Nguyen et al. |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0074034 A1 | 3/2010 | Cazzaniga |
| 2010/0085794 A1 | 4/2010 | Chen et al. |
| 2010/0244935 A1 | 9/2010 | Kim et al. |
| 2011/0133820 A1 | 6/2011 | Pan |
| 2011/0148509 A1 | 6/2011 | Pan |

FOREIGN PATENT DOCUMENTS

| | | |
|---|---|---|
| EP | 0 780 515 A | 6/1997 |
| JP | 2007-020268 A | 1/2007 |
| WO | 01/06336 A1 | 1/2001 |
| WO | WO 2006/132757 | 12/2006 |

OTHER PUBLICATIONS

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

U.S. Appl. No. 12/506,998 entitled "Charge Pump with Current Based Regulation" filed Jul. 21, 2009, 21 pages.

U.S. Appl. No. 12/634,385 entitled "Multi-Stage Charge Pump with Variable Number of Boosting Stages" filed Dec. 9, 2009, 33 pages.

Patent Application for U.S. Appl. No. 12/973,641, filed Dec. 20, 2010, 26 pages.

Patent Application for U.S. Appl. No. 12/973,493, filed Dec. 20, 2010, 28 pages.

Patent Application for U.S. Appl. No. 13/228,605, filed Sep. 9, 2011, 21 pages.

Charging Half Cycle

FIG. 1A
*(PRIOR ART)*

Transfer Half Cycle

DYNAMIC SWITCHING APPROACH TO REDUCE AREA AND POWER CONSUMPTION OF HIGH VOLTAGE CHARGE PUMPS

FIELD OF THE INVENTION

This invention pertains generally to the field of charge pumps and more particularly to high voltage charge pump systems to provide multiple regulated output levels.

BACKGROUND

Figure 1A:
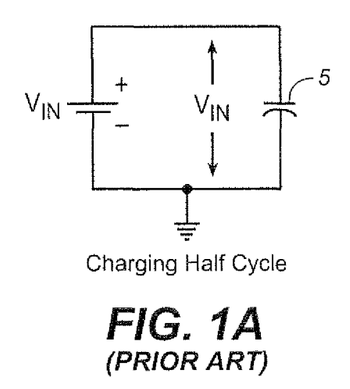
FIG. 1a is a simplified circuit diagram of the charging half cycle in a generic charge pump.
Figure 1B:
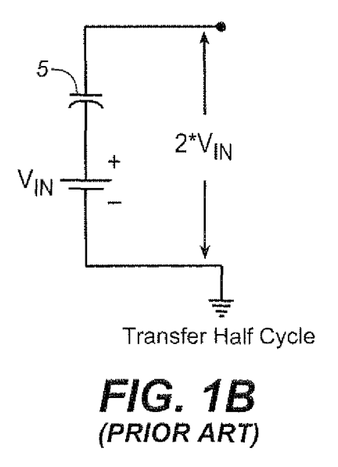
FIG. 1b is a simplified circuit diagram of the transfer half cycle in a generic charge pump.

Charge pumps use a switching process to provide a DC output voltage larger than its DC input voltage. In general, a charge pump will have a capacitor coupled to switches between an input and an output. During one clock half cycle, the charging half cycle, the capacitor couples in parallel to the input so as to charge up to the input voltage. During a second clock half cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Figure 2:
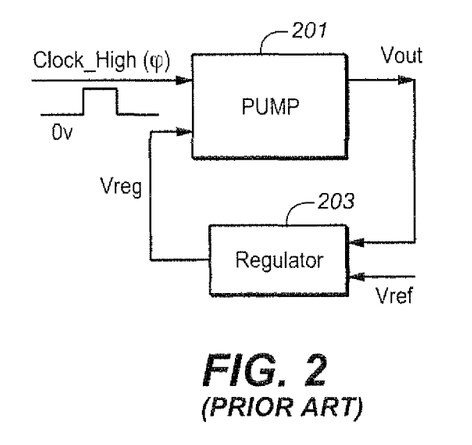
FIG. 2 is a top-level block diagram for a regulated charge pump.

FIG. 2 is a top-level block diagram of a typical charge pump arrangement. A pump 201 has as inputs a clock signal and a voltage Vreg and provides an output Vout. The high (Vdd) and low (ground) connections are not explicitly shown. The voltage Vreg is provided by the regulator 203, which has as inputs a reference voltage Vref from an external voltage source and the output voltage Vout. The regulator block 203 regulates the value of Vreg such that the desired value of Vout can be obtained. (A charge pump is typically taken to refer to both the pump portion 201 and the regulator 203, when a regulator is included, although in some usages "charge pump" refers to just the pump section 201.)

Charge pumps are used in many contexts. For example, they are used as peripheral circuits on EEPROM, flash EEPROM and other non-volatile memories to generate many of the needed operating voltages, such as programming or erase voltages, from a lower power supply voltage. In such applications, multiple different boosted, regulated values are needed to be accurately and concurrently supplied. A number of charge pump designs are know in the art, but given the common reliance upon charge pumps, there is an on going need for improvements in charge pump system design, including systems to provide multiple outputs.

SUMMARY OF THE INVENTION

According to a first set of aspects, a charge pump system provides multiple regulated voltage levels. The charge pump system includes a plurality of N charge pump circuits each having an output connected to a corresponding output voltage and a plurality of N regulation circuits. Each of the regulation circuits is connected to a corresponding one of the charge pumps to receive the output voltage of the pump and to provide a control signal to the corresponding pump for the regulation of the corresponding charge pump to a corresponding regulated output voltage, where each of the plurality of regulated output voltage are different. The charge pump system also includes a supplemental charge pump circuit and a plurality of N switches. Each of the switches is connected between the output of the supplemental charge pump circuit and the output of a corresponding one of the plurality of charge pump circuits and each is connected to the corresponding one of the regulation circuits, whereby the output of supplemental charge pump is individually connected to the output of each of the plurality of charge pumps when in recovery and disconnected when regulated.

According to additional aspects, a method of operating a charge pump system is presented. The system includes a first charge pump to provide a first output voltage, a first regulation circuit connected to the first charge pump to regulate the first output voltage to a first regulated level, a second charge pump to provide a second output voltage, a second regulation circuit connected to the second charge pump to regulate the second output voltage to a second regulated level, and a supplemental charge pump. The first regulated level is lower than the second regulated level. In response to both the first and second output voltage being less than the first regulated level and the first and second charge pumps being operated in recovery mode, the supplemental charge pump is operated with its output connected to outputs of both of the first and the second charge pumps. In response to the first output voltage reaching the first regulated level and the second output voltage being less than the second regulated level and the second charge pump being operated in recovery mode, the output voltage of the first charge pump is subsequently regulated at the first regulated level by the first regulation circuit and the supplemental charge pump is operated with its output connected to output of the second, but not the first, of the charge pumps. In response to the second output voltage reaching the second regulated level, the output voltage of the first charge pump is subsequently regulated at the first regulated level by the first regulation circuit and the output voltage of the second charge pump is regulated at the second regulated level by the second regulation circuit, where the outputs of neither of the of the first and the second charge pumps is connected to receive the output of the supplemental charge pump.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

Charge pumps are typically used as peripheral elements are a circuit that needs higher voltages than the supply level. An example is a non-volatile memory, such as flash memory, where charge pumps are used to provide the high voltages used in programming and erasing memory cells, and also for the various voltages used in sensing and verifying the memory cells. In such arrangements, a number of different, accurately determined values may be needed, such the programming voltages of each of the steps in a programming staircase type waveform, or the many voltages levels used for sensing in multi-state NAND arrays. During read and verify operations, a number of different levels may be needed concurrently. For example, during a read operation, the word lines running across a NAND string will concurrently require several different values: the level applied to a selected word line and one or more different levels applied to the non-selected word lines. (More detail on such memory systems can be found in US patent publication US-2009-0296488-A1, for example.) A system of several different pumps providing outputs regulated to different levels is needed to accurate provide these various levels.

Due to a large number of word lines in each NAND-string and various applicable boosting options, the load for each of the pump outputs can vary from a few word lines load to most of the word lines in a selected block. Previous pump systems were typically designed to deal with this problem by having many pump units. Depend on the load requirement for each of supplies, the system could assign some number of these pump units for each output. According to some of the principle aspects presented here is an approach to reduce the number of pumps needed in the system and, consequently, reduce both the high voltage generation area and power consumption.

Considering previous approaches further, these would typically be designed with many pump units, each capable of adequately supplying a given number of word lines while under regulation. For example, if one pump unit can supply a load of eight word lines, then, say, 87 word lines will need total of 11 pump units. Based on how many word lines are assigned to each of the different output levels, the system decodes logic signals to assign the number of pump units accordingly. When these different levels ramp up, the word lines should preferably ramp up with the same level, as any word line to word line differential can lead to a disturb. To minimize the outputs' ramp up differences, switches can be added that connect outputs together when the word lines start to ramp up, which are then released as the outputs reached their regulation levels.

Figure 3:
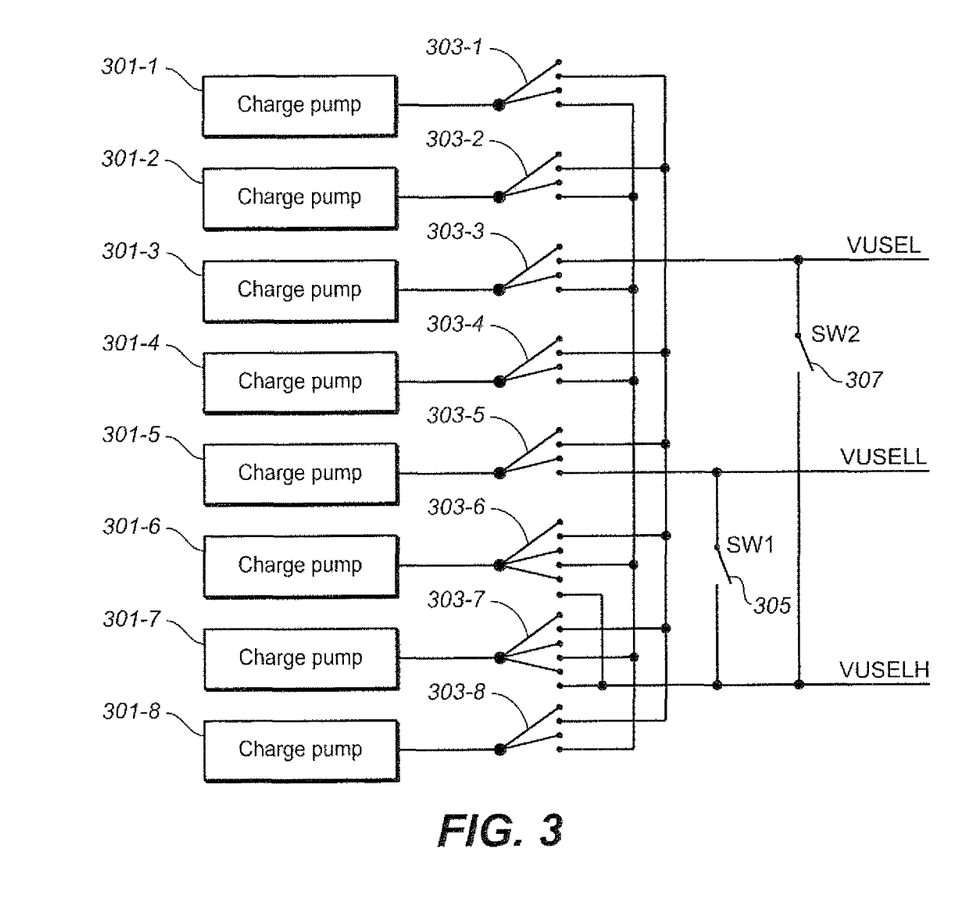
FIG. 3 shows a charge pump system of multiple pumps that may be connected to provide several different regulated output levels.
Figure 4:
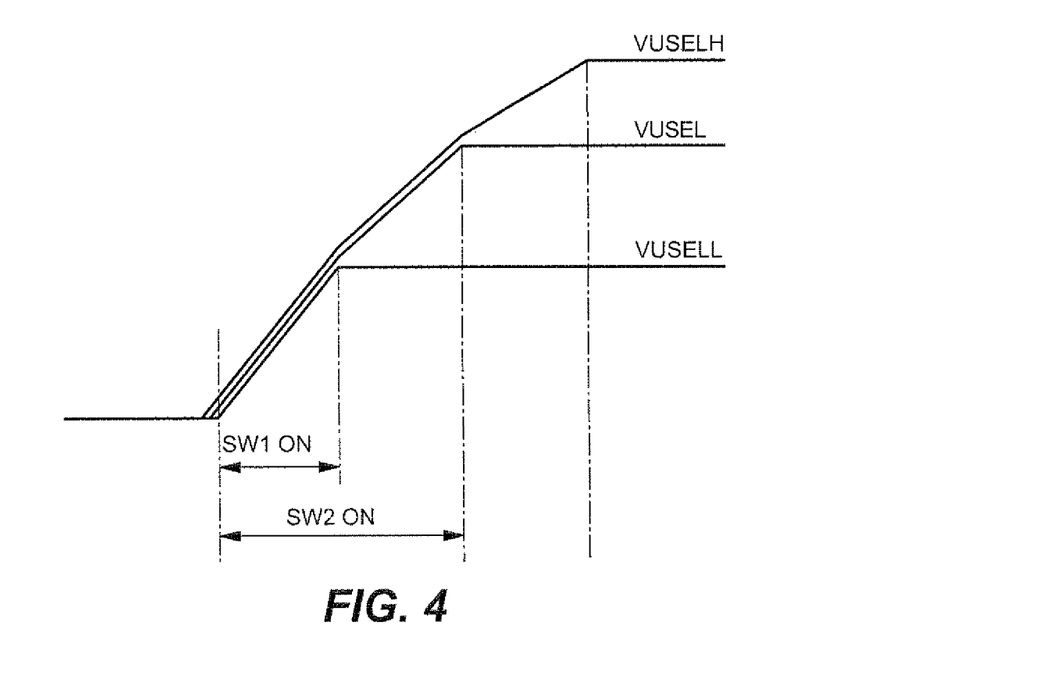
FIG. 4 shows the outputs for the system of FIG. 3 during ramp up and regulation.
Figure 5:
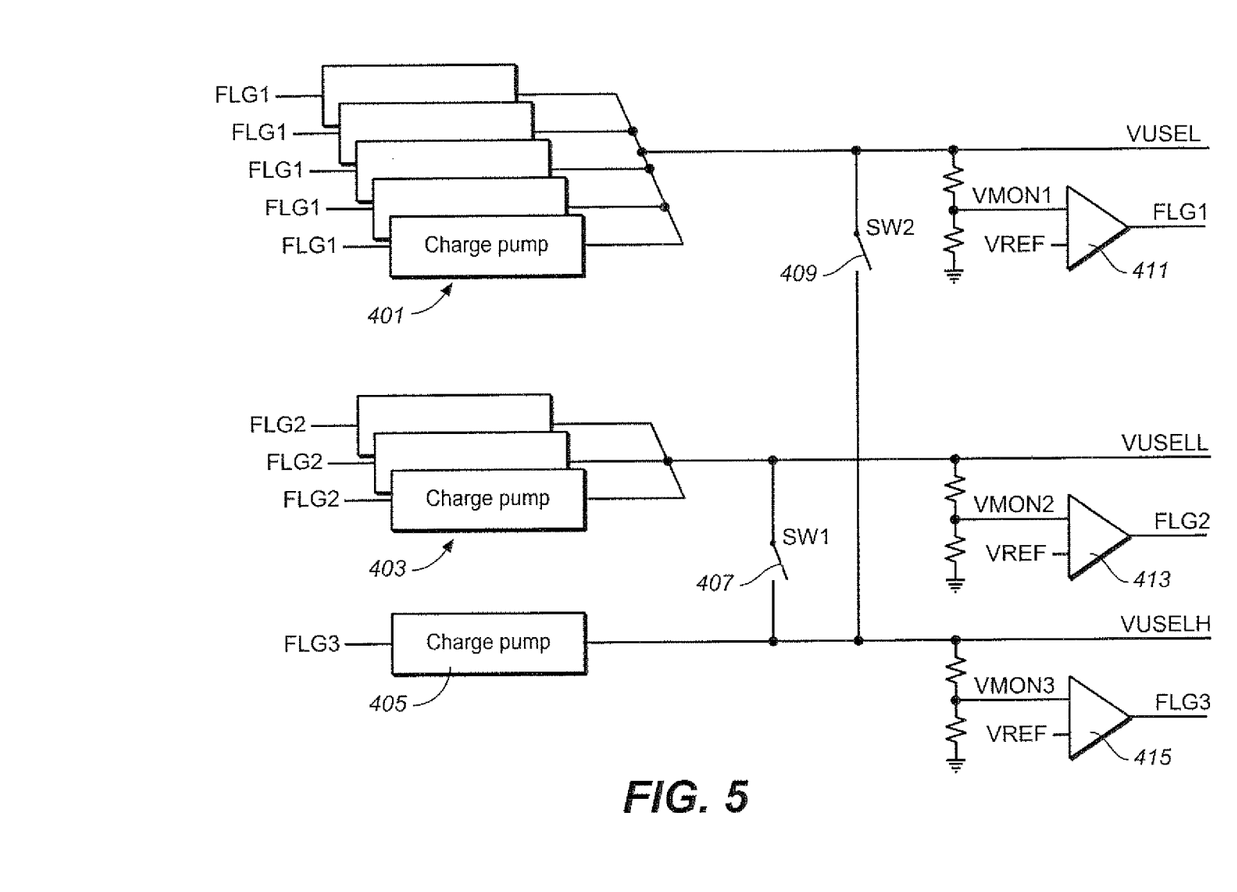
FIG. 5 is a system like that of FIG. 3 for a particular configuration.

This can be considered further with respect to FIGS. 3-5. FIG. 3 shows a number of charge pumps 301-1 to 301-8 that are connectable through the respective sets of switches 303-1 to 303-8 to connect the pumps to the outputs VUSEL, VUSELL, and VUSELH. Here, VUSEL represents an intermediate output level, VUSELL a lower output level, and VUSELH a higher output level, such as would be applied to different word lines of an NAND array in a sensing operation or for non-selected word lines in a programming operation. In this example, fewer word lines will be driven at the highest level, so only 301-6 and 301-7 are connectable to drive the highest level VUSELH, while all of the pump can be connected to drive the other two levels. The switches SW1 305 and SW2 307 are added to be able to selectively connect the different outputs together for ramp control.

By designing a pump system with many such pump unit, they can be pre-selected to supply for VUSEL, VUSELL or VUSELH based on the boosting option and location of currently selected word line. To minimize the difference in VUSEL, VUSELL, VUSELH ramp up curves, the switches SW1 305 and SW2 307 are added to connect the outputs together before reaching each of the corresponding regulation levels, as illustrated in FIG. 4.

FIG. 4 shows the system outputs of VUSEL, VUSELL, and VUSELH as the ramp up during recovery and reach their respective regulation levels. Initially, as the pumps are enabled and begin to ramp up, both SW1 305 and SW 307 are ON to connect the outputs so that VUSEL/VUSELL/VUSELH ramp up together. When VUSELL, the lowest level, reaches its regulation level, SW1 305 is turned OFF, VUSELL is operated under regulation, while VUSEL and VUSELH continue to ramp up together with SW2 307 remaining ON. SW2 307 is then turned OFF when VUSEL reaches the corresponding regulation level, after which the VUSEL level is operated under regulation while the VUSELH continues to ramp up to its regulation level. Note that as a fewer number of pump drive the output at each segment of the ramping, the rate rolls off once SW1 305 is turned off and rolls off further once SW2 307 is also off.

FIG. 5 corresponds to a particular configuration of the pump system FIG. 3, with a schematic representation of the regulation circuitry included. As discussed above, due to the large number of word lines in each NAND-string in a typical memory system, and various applicable boosting options, loading for each of the pump outputs can vary in each block can vary significantly. Based on an example of a boosting option and location of a selected word line, the number of pump units are pre-decoded in FIG. 5 to carry the output loads to required with a set 401 of 5 pump units for VUSEL, corresponding to a load of 61 word line, a set 403 of 3 pump units for the lower level VUSELL, corresponding to a 24 word line load, and a single pump 405 to supply the high level for VUSELH a load of two word lines. The pumps may all be structured the same, or have differences. For example, the pumps for the higher levels may include more stages if the differences in levels are large enough to justify this. Each output VUSEL, VUSELL and VUSELH has a corresponding regulation circuit including a resistive divider providing respective comparison value VMON1, VMON2, and VMON3 that is compared a reference level VREF in a comparator 411, 413 and 415 to provide the control signals FLG1, FLG2 and FLG3. The flag signals FLG1, FLG2, FLG3 are then provided to the regulate the pumps that are generating corresponding output levels. (Here, each pump is shown receiving only the single flag signal to which it is currently responsive, but when system can be configured so that a pump may be used to generate different levels, it would correspondingly be connectable to receive all these levels as appropriate.) FIG. 5 only shows a basic regulation arrangement based on a pair of series resistances, but other arrangements, such as that described in U.S. patent application Ser. No. 13/240,623, entitled "High Voltage Charge Pump Regulation System With Fine Step Adjustment" by Qui Vi Nguyen and Trung Pham, that is being filed concurrently herewith or in the other references cited below, can be used.

As also with FIG. 3, to control and coordinate the outputs' ramp rate, the switches SW1 407 and SW2 409 are added, where the switches turn ON from the start of ramp up until the output reach regulation level. The comparators 413 and 411, which receptively detect the VUSELL and VUSEL pump output levels, respectively send flag signals (connections not explicitly shown) FLG2 and FLG1 to turn OFF switches SW1 and SW2.

As can be seen from FIG. 3, the sort of arrangement described there requires a large number of individual pumps connected though a large number of switches under a rather involved arrangement. This complicated arrangement further requires more layout area and draws more current that is preferable. To help to overcome these limitations, the preferred embodiments presented below use a dynamic switch approach for the pump system where the pump connections are independent of the number of word lines forming the load for each output. According to a principle aspect, one large pump is designed to be shared between all of the outputs for use during the ramp up during recovery, with each output level also have one designated pump to maintain its level when under regulation. For the three output example as in FIGS. 3-5, this corresponds to one large and three small pumps. Each small pump is designed with capability that can maintain VUSEL, VUSELL, VUSELH at its regulation level. Each of these pumps can be tailored to the corresponding output level, such as the number of stages being higher in the pump to supply the higher output level. The large pump unit is constructed to be ample to provide sufficient drive to be able to assist in the ramp up phase for all of the outputs and has as many switches needed to connect the pump with all the needed outputs. When of the levels reach its regulation level, the switch will turn OFF. For example, as discussed below with respect to FIG. 6, switches S1, S2, S3 are respectively turned ON during VUSEL, VUSELL, VUSELH ramp up. Once VUSELL reaches its regulation level, S1 turns OFF and only charge pump for that level (CP1) continues to maintain VUSELL in regulation, with a similar arrangement for VUSEL and VUSELH. The comparator of each level's regulation circuitry detects the corresponding output levels and send flag signals to turn off the switches. An exemplary embodiment is discussed with respect to FIGS. 6 and 7.

Figure 6:
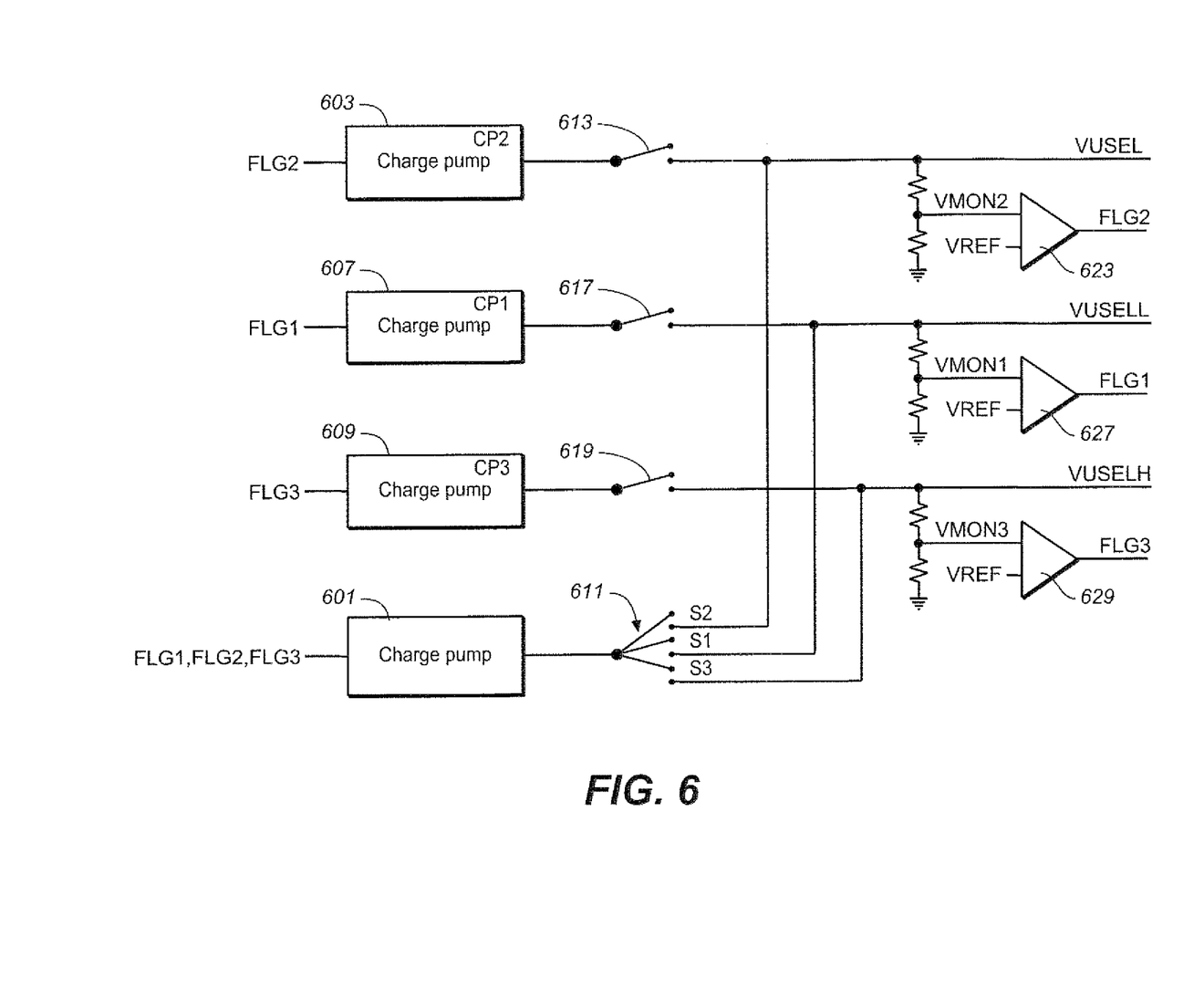
FIG. 6 is an exemplary embodiment of a charge pump system to provide multiple regulated outputs.

In FIG. 6, as well as in the preceding figures, only a block representation of charge pumps and a basic implementation of regulation circuitry has been given. With respect to the charge pump itself, any of the various designs (voltage doubler, Dickson type, and so on) can be used. Similarly, there are may ways for how the output is regulated based upon the control signal, such as varying the frequency of the input clock signal, the amplitude of the input voltage, the number of stages, and so on. More details on these aspects, which can be applied to the exemplary embodiments below as well as to the examples above can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; 7,135,910; 7,973,592; and 7,969,235; US Patent Publication numbers 2009-0153230-A1; 2009-0153232-A1; 2009-0315616-A1; 2009-0322413-A1; 2009-0058506-A1; US-2011-0148509-A1; 2007-0126494-A1; 2007-0139099-A1; 2008-0307342 A1; and 2009-0058507 A1; and application Ser. Nos. 12/973,641 and 12/973,493, both filed Dec. 20, 2010. More detail on regulation circuitry with an adjustable output level can also be found in and a U.S. patent application Ser. No. 13/240,623, entitled "High Voltage Charge Pump Regulation System With Fine Step Adjustment" by Qui Vi Nguyen and Trung Pham, that is being filed concurrently herewith.

Referring now to FIG. 6, this shows an exemplary embodiment to provide three regulated levels, although the technique readily extends to other numbers. For this particular example, these can be taken as three different levels applied to unselected word lines or select lines of a NAND array, an intermediate level VUSEL, a higher level VUSELH, and a lower level VUSELL. The system includes one large pump 601 and the small pump units CP1 607 to generate VUSELL, CP2 603 to generate VUSEL, and CP3 609 VUSELH. The small pump units are each capable of maintaining the corresponding pump output level in regulation. Each of the small pump units (603, 607, 609) needs only one switch (613, 617, 619 respectively) to enable when the corresponding output is required. The large pump 601 supplies the additional current to raise all the other pumps to their regulation level, but is not itself used once all the output levels are under regulation. Switches S1, S2, and S3, collectively 611 with one switch for each output to which the large pump 601 is connectable, allow the larger pump to add to each of the output and keep the levels of each output the same during ramp up. These switches thus connect the output of 601 to each of the outputs ramping up as well to each out other until they each reach their respective regulation levels.

The outputs of each of CP1 607, CP2 603, CP3 609 is connected to corresponding regulation circuitry, here again represented by a resistive divider providing a corresponding comparison level VMON1, VMON2, VMON3 to a corresponding comparator 627, 623, 629 where it is compared to a reference level VREF to generate a corresponding control signal FLG1, FLG2, FLG3. Each of the pumps CP1 607, CP2 603, CP3 is then responsive to its corresponding flag signal FLG1, FLG2, FLG3. The large pump can then also be responsive to these control signals, or at least that corresponding to the highest of the output levels, as it will no longer contribute once the highest level is at its regulated level. The comparators also send the flag signals to the set of switches 611 so that S1, 52, and S2 can be respectively turned off based on FLG1, FLG2 and FLG3.

Figure 7:
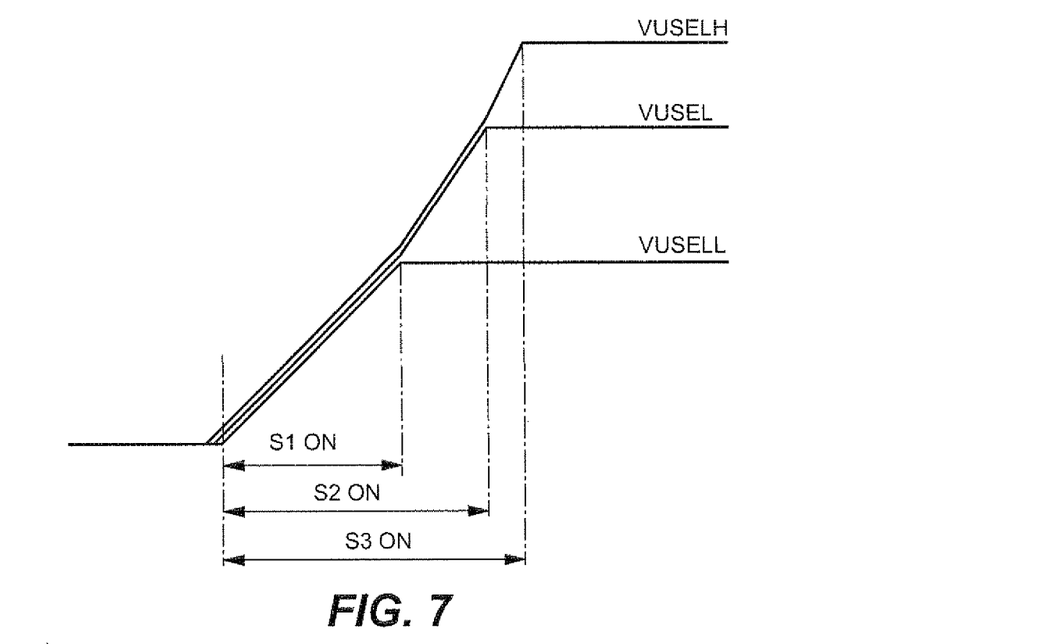
FIG. 7 shows the outputs for the system of FIG. 6 during ramp up and regulation.

FIG. 7 illustrates the outputs of the arrangement of Figure as they ramp up and reach their regulated output levels. Initially, when all the levels are low, all of the switches, including S1, 52 and S3, are ON to connect the outputs, so that VUSEL/VUSELL/VUSELH ramp up together. When VUSELL reach regulation, S1 is turned OFF, leaving only the smaller pump CP1 607 keep VUSELL in regulation, while the larger pump 601 will continue to help the other outputs (VUSEL, VUSELH) to ramp up faster. S2 then switches OFF when VUSEL reach regulation, leaving the auxiliary large pump unit 601 now helping only VUSELH ramp with a faster rate. Compared with FIG. 4, note that results in the higher levels ramping up successively faster, whereas in FIG. 4 that rate tends to roll off. The large pump 601 is then disconnected (S3 OFF) the pump can turn off when all outputs have reached regulation.

As noted, although the exemplary embodiment has three outputs, the techniques readily apply to other numbers of outputs. Whatever the number of outputs, the system's outputs can be shared to drive the same load. Depending upon the application of the circuit, such as the in the case of the unselected word lines of a NAND memory where this is dependent upon the selected word line's location, each output may have a different capacitive load. By combining the outputs so that they are sharing the same load, this allows all of outputs ramp up with the same rate, which can be important in both read and program operations for better accuracy and less disturb by minimizing word line to word line voltage differentials.

Another important aspect of this arrangements is that during regulation the individual charge pumps (e.g. CP1 607), which are smaller than the supplemental charge pump 601, are able to maintain the corresponding output at its regulation level. Since the individual charge pumps are small, the ripple produced by them during regulation also small, reducing or eliminating the need for a noise/ripple filter system for the outputs.

By sharing the output larger supplemental charge pump between the outputs, the large pump can help each of the outputs within the system ramp up together with the same ramp rate until they each reach their respective regulation level. Consequently, the system can have better ramp up time, meeting the same specification with less pump area and power consumption. The supplemental charge pump only needs to be enabled during ramp up time and can be turn off after all outputs are in regulation. Since the individual charge pumps that maintain the outputs in regulation are small, the outputs ripple also small and thus the system has little if any need of a ripple filter system as in a conventional approach.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump system to provide multiple regulated voltage levels, comprising:
    a plurality of N charge pump circuits each having an output connected to a corresponding output voltage;
    a plurality of N regulation circuits, each connected to a corresponding one of the charge pumps to receive the output voltage thereof and provide a control signal thereto for the regulation of the corresponding charge pump to a corresponding regulated output voltage, wherein each of the plurality of regulated output voltage are different;
    a supplemental charge pump circuit; and
    a plurality of N switches, each connected between the output of the supplemental charge pump circuit and the output of a corresponding one of the plurality of charge pump circuits and each connected to the corresponding one of the regulation circuits, whereby the output of supplemental charge pump is individually connected to the output of each of the plurality of charge pumps when in recovery and disconnected when regulated.

2. The charge pump system of claim 1, wherein N equals three.

3. The charge pump system claim 1, wherein said charge pump system is formed as peripheral circuitry on a non-volatile memory circuit and wherein the output voltages are word line voltages.

4. The charge pump system of claim 1, wherein the supplemental charge pump is of greater drive capability than each of the plurality of N charge pumps.

5. The charge pump system of claim 1, wherein the supplemental charge pump is disabled when disconnected from all of the plurality of N charge pumps.

6. A method of operating a charge pump system, the system including a first charge pump to provide a first output voltage, a first regulation circuit connected to the first charge pump to regulate the first output voltage to a first regulated level, a second charge pump to provide a second output voltage, a second regulation circuit connected to the second charge pump to regulate the second output voltage to a second regulated level, and a supplemental charge pump, where the first regulated level is lower than the second regulated level, the method comprising:
    in response to both the first and second output voltage being less than the first regulated level and the first and second charge pumps being operated in recovery mode, operating the supplemental charge pump with the output thereof connected to outputs of both of the first and the second charge pumps;
    in response to the first output voltage reaching the first regulated level and the second output voltage being less than the second regulated level and the second charge pump being operated in recovery mode, subsequently regulating the output voltage of the first charge pump at the first regulated level by the first regulation circuit and operating the supplemental charge pump with the output thereof connected to output of the second, but not the first, of the charge pumps; and
    in response to the second output voltage reaching the second regulated level, subsequently regulating the output voltage of the first charge pump at the first regulated level by the first regulation circuit and regulating the output voltage of the second charge pump at the second regulated level by the second regulation circuit, where the outputs of neither of the of the first and the second charge pumps is connected to receive the output of the supplemental charge pump.

7. The method of claim 6, further comprising:
    in response to the second output voltage reaching the second regulated level, disabling the supplemental charge pump.

8. The method of claim 6, wherein the charge pump system is formed as peripheral circuitry on a non-volatile memory circuit, the method further comprising:
    selectively supplying the first and second regulated levels to one or more word lines of the non-volatile memory circuit.

9. The method of claim 6, wherein the supplemental charge pump is of greater drive capability than the first and second charge pumps.

10. The method of claim 6, wherein the charge pump system further includes a third charge pump to provide a third output voltage and a third regulation circuit connected to the third charge pump to regulate the third output voltage to a third regulated level, where the third regulated level is intermediate to the first and second regulated levels, the method further comprising:
    in response to the third output voltage being less than the third regulated level, operating the supplemental charge pump with the output thereof connected to outputs of the third charge pumps; and
    in response to the third output voltage reaching the third regulated level, subsequently regulating the output voltage of the third charge pump at the third regulated level by the third regulation circuit and operating the supplemental charge pump with the output thereof not connected to output of the third charge pump.

* * * * *